(12) United States Patent
Escoffier (10) Patent No.: US 10,090,387 B2
(45) Date of Patent: Oct. 2, 2018

(54) ELECTRONIC DEVICE WITH A REVERSE BIASED HEMT TRANSISTOR

(71) Applicants: COMMISSARIAT A L'ENERGIE ATOMIQUE ET AUX ENE ALT, Paris (FR); ALCATEL LUCENT, Paris (FR)

(72) Inventor: Rene Escoffier, La Buisse (FR)

(73) Assignees: Commissariat à l'énergie atomique et aux energies alternatives, Paris (FR); ALCATEL LUCENT, Paris (FR)

(*) Notice: Subject to any disclaimer, the term of this patent is extended or adjusted under 35 U.S.C. 154(b) by 125 days.

(21) Appl. No.: 14/632,411

(22) Filed: Feb. 26, 2015

(65) Prior Publication Data

US 2015/0243737 A1    Aug. 27, 2015

(30) Foreign Application Priority Data

Feb. 27, 2014    (FR) ...................... 14 51600

(51) Int. Cl.
*H01L 29/20*    (2006.01)
*H03K 17/687*    (2006.01)
(Continued)

(52) U.S. Cl.
CPC ...... *H01L 29/2003* (2013.01); *H01L 21/8252* (2013.01); *H01L 27/0248* (2013.01);
(Continued)

(58) Field of Classification Search
CPC ............ H01L 21/8252; H01L 27/0248; H01L 27/0605; H01L 29/2003; H01L 29/7786;
(Continued)

(56) References Cited

U.S. PATENT DOCUMENTS 7,616,418 B2 * 11/2009 Harris .................... H02H 9/025
                                                   361/58
8,745,569 B2 *  6/2014 Ueno ................... H01L 21/8252
                                                   716/107
(Continued)

FOREIGN PATENT DOCUMENTS

JP          1-137827       5/1989
JP          2011-151528    8/2011
WO     WO 2011/067903 A1   6/2011

OTHER PUBLICATIONS

French Preliminary Search Report dated Oct. 22, 2014 in French Application 14 51600, filed on Feb. 27, 2014 ( with English Translation of categories of Cited Documents).

(Continued)

*Primary Examiner* — Lincoln Donovan
*Assistant Examiner* — Colleen O Toole
(74) *Attorney, Agent, or Firm* — Oblon, McClelland, Maier & Neustadt, L.L.P.

(57) ABSTRACT

An electronic device having at least a first HEMT transistor and bias circuit able to at least reverse bias the first HEMT transistor by applying an electric voltage $V_{SD}$ of a positive value between a source of the first HEMT transistor and a drain of the first HEMT transistor. The first HEMT transistor is able to be ON when a value of an electric voltage $V_{GD}$ between a gate of the first HEMT transistor and the drain of the first HEMT transistor is higher than a value of a threshold voltage $V_{th}$ of the first HEMT transistor. The electronic device has, during a forward biasing, a behavior similar to that of a forward biased or reverse biased Zener diode.

9 Claims, 4 Drawing Sheets

(51) Int. Cl.
  *H01L 21/8252* (2006.01)
  *H01L 27/02* (2006.01)
  *H01L 29/778* (2006.01)
  *H01L 27/06* (2006.01)
  *H03K 17/30* (2006.01)

(52) U.S. Cl.
  CPC ...... *H01L 27/0605* (2013.01); *H01L 29/7786* (2013.01); *H03K 17/302* (2013.01); *H03K 17/687* (2013.01); *H03K 2017/307* (2013.01)

(58) Field of Classification Search
  CPC .............. H03K 17/302; H03K 17/687; H03K 2017/307
  See application file for complete search history.

(56) References Cited

U.S. PATENT DOCUMENTS

| | | | |
|---|---|---|---|
| 9,029,909 B2* | 5/2015 | Blanchard | H01L 29/0817 257/129 |
| 9,053,964 B2* | 6/2015 | Jeon | H01L 21/8252 |
| 9,263,439 B2* | 2/2016 | Zhang | H01L 27/085 |
| 2006/0175633 A1 | 8/2006 | Kinzer | |
| 2009/0072269 A1 | 3/2009 | Suh et al. | |
| 2012/0200339 A1 | 8/2012 | Ikeda | |
| 2013/0325380 A1 | 12/2013 | Behnke, II et al. | |

OTHER PUBLICATIONS

Zhongda Li et al. "High Voltage Normally-off GaN MOSC-HEMTs on Silicon Substrates for Power Switching Applications", CFES Annual Conference. 2013, 11 pages.

* cited by examiner

ELECTRONIC DEVICE WITH A REVERSE BIASED HEMT TRANSISTOR

TECHNICAL FIELD AND PRIOR ART

The invention relates to the field of microelectronic components, and more particularly an electronic device having a behaviour analogous to that of a Zener diode at least when the same is reverse biased. Such an electronic device is advantageously used to regulate an electric voltage in an electronic circuit, act as a voltage reference, protect electronic circuits, or even enable a voltage monitor to be made. The invention also relates to a method for controlling the flow of an electric current in an electrical connection via the use of a reverse biased HEMT transistor.

Unlike a conventional diode which is ON only when it is forward biased ($V_{anode} - V_{cathode} > 0$), that is which lets an electric current flow only in a single direction, the forward direction (from anode to cathode of the diode), a reverse biased Zener diode ($V_{cathode} - V_{anode} > 0$) also lets an electric current flowing in the reverse direction (from cathode to anode of the Zener diode) only if the voltage across its terminals ($V_{cathode} - V_{anode}$) is higher than a certain value corresponding to the avalanche effect threshold of the Zener diode and which is also called the Zener voltage. Moreover, given that the reverse biased Zener diode also holds the voltage across its terminals to a value substantially equal to the Zener voltage regardless of the value of the reverse current passing through the Zener diode, the Zener diode enables for example a voltage regulation to be readily made for voltage ranges from a few volts to several tens volts with an accuracy of about 100 mV.

A Zener diode is formed by a strongly doped PN junction and the value of its Zener voltage depends on the technology with which the Zener diode is made.

There are electronic devices having a behaviour similar to that of a Zener diode the value of the Zener voltage of which would be adjustable, or programmable. Such electronic devices, as for example the regulator TL431/TL432, are however complex and involve numerous electronic components such as transistors, capacitors, resistors and diodes.

There are also electronic devices having a behaviour similar to that of a Zener diode which would be bidirectional, that is that, in the case of a reverse bias, would let the reverse current flow only if the voltage across its terminals ($V_{cathode} - V_{anode}$) is higher than the value of a first Zener voltage and, in the case of a forward bias, would let the forward current flow only if the voltage across its terminals ($V_{cathode} - V_{anode}$) is lower than the value of a second Zener voltage. Such electronic devices have the drawbacks of having an operating temperature restricted to about 175° C. because beyond this, the values of the Zener voltages are no longer insured because these values, based on an avalanche phenomenon, increase with temperature. This drawback is also found for simple Zener diodes because the value of the Zener voltage is based on an avalanche phenomenon within the diode.

DISCLOSURE OF THE INVENTION

Thus there is a need to provide an electronic device having a behaviour analogous to that of a reverse biased Zener diode, namely that is ON only when the voltage across its terminals exceeds some value, which does not require numerous electronic components for its manufacture, and that can be used for operating temperature ranges higher than those of devices of prior art.

To do this, an electronic device is proposed and includes at least:
a first HEMT transistor,
bias means able to at least reverse bias the first HEMT transistor by applying an electric voltage $V_{SD}$ of a positive value between a source of the first HEMT transistor and a drain of the first HEMT transistor,
and wherein the first HEMT transistor is able to be ON when a value of an electric voltage $V_{GD}$ between a gate of the first HEMT transistor and the drain of the first HEMT transistor is higher than a value of a threshold voltage $V_{th}$ of the first HEMT transistor.

It is also proposed an electronic device including at least:
a first HEMT transistor and a second HEMT transistor,
bias means able to at least reverse bias the first HEMT transistor by applying an electric voltage $V_{SD}$ of a positive value between a source of the first HEMT transistor and a drain of the first HEMT transistor,
wherein:
the first HEMT transistor is able to be ON when a value of an electric voltage $V_{GD}$ between a gate of the first HEMT transistor and the drain of the first HEMT transistor is higher than a value of a threshold voltage $V_{th}$ of the first HEMT transistor,
the gate of the first HEMT transistor is electrically connected to the source of the first HEMT transistor,
the electronic device being configured according to a first configuration or a second configuration, the first configuration being such that:
a source of the second HEMT transistor is electrically connected to the source of the first HEMT transistor,
a drain of the second HEMT transistor is electrically connected to the drain of the first HEMT transistor,
a gate of the second HEMT transistor is electrically connected to the source of the second HEMT transistor via at least one first resistor of a value higher than about 1 MΩ and is electrically connected to the drain of the second HEMT transistor via at least one second resistor of a value higher than about 1 MΩ,
a value of a threshold voltage $V_{th2}$ of the second HEMT transistor is zero,
the bias means are also able to forward bias the first HEMT transistor and the second HEMT transistor by applying an electric voltage $V_{SD}$ of a negative value,
the second configuration being such that:
the source of the second HEMT transistor is electrically connected to the drain of the first HEMT transistor,
the drain of the second HEMT transistor is electrically connected to the source of the first HEMT transistor,
the gate of the second HEMT transistor is electrically connected to the source of the second HEMT transistor,
the second HEMT transistor is able to be ON when the value of an electric voltage $V_{GD2}$ between the gate of the second HEMT transistor and the drain of the second HEMT transistor is higher than that of a threshold voltage $V_{th2}$ of the second HEMT transistor.

Such an electronic device resorts to properties until now unused of a HEMT ("High Electron Mobility Transistor") transistor. Indeed, in this electronic device, unlike a conventional use of the HEMT transistor which is forward biased, that is to which an electric voltage $V_{DS}$ of a positive value is applied between the drain and the source of the HEMT transistor, the HEMT transistor is herein diverted from its usual use and is reverse bias, via the application of an electric voltage $V_{SD}$ of a positive value between the source and the drain of the HEMT transistor. With such a reverse biased of the HEMT transistor, the current flows in the HEMT transistor from the source to the drain, whereas in a conventional use of such a HEMT transistor, the current flows from the drain to the source. But, a reverse biased HEMT transistor is able to be ON when the value of the electric voltage $V_{GD}$ between the gate and the drain of the HEMT transistor is higher than the value of the threshold voltage $V_{th}$ of the HEMT transistor. Thus, it is possible to define a value of the bias voltage of the HEMT transistor, called the Zener voltage, via the adjustment of the value of the threshold voltage $V_{th}$ of the HEMT transistor and/or the value of the voltage $V_{GS}$ between the gate and the source of the HEMT transistor, beyond which the HEMT transistor is ON and enabling the current to flow from the source to the drain of the HEMT transistor, and below which the HEMT transistor is OFF. Such an electronic device thus enables the value of the voltage to be readily adjusted across its terminals beyond which the current can pass through the electronic device.

Such an electronic device thus has a behaviour analogous to that of a reverse biased Zener diode. Moreover, this electronic device does not require numerous electronic components for its manufacture. This electronic device can further be used for temperature ranges higher than those of devices of prior art, for example between about −40° C. and +300° C., or even more.

The gate of the first HEMT transistor is electrically connected to the source of the first HEMT transistor.

The electronic device has, during a forward biasing, a behaviour similar to that of a forward biased or reverse biased Zener diode.

In this case, the gate of the first HEMT transistor may be directly electrically connected to the source of the first HEMT transistor and the first HEMT transistor may be of the enhancement type (or "normally off"). Thus, the value of the voltage $V_{GS}$ between the gate and the source of the first HEMT transistor is zero and the value of the voltage beyond which the current can pass through the electronic device can be set via the adjustment of the value of the threshold voltage $V_{th}$ of the first HEMT transistor (because the HEMT transistor is ON when $V_{SD} > V_{th} - V_{GS}$).

Alternatively, the gate of the first HEMT transistor may be electrically connected to the source of the first HEMT transistor via a first voltage source able to apply an electric voltage $V_{GS}$ of a non-zero value between the gate of the first HEMT transistor and the source of the first HEMT transistor. In this case, unlike a conventional use of the gate of a HEMT transistor which consists in making the transistor more or less ON when the HEMT transistor is forward biased, the gate of the first HEMT transistor is here used to offset the value of the voltage from which the first HEMT transistor, and thus also the electronic device, will switch from a totally OFF state to an ON state with a very small resistivity. Thus, the value of the voltage beyond which the current can pass through the electronic device can be set via the adjustment of the value of the threshold voltage $V_{th}$ of the first HEMT transistor and/or via the a posteriori adjustment of the value of the voltage $V_{GS}$ outputted by the first voltage source. This alternative enables an electronic device the behaviour of which corresponds to that of a programmable Zener diode to be made.

The electronic device may further include a second HEMT transistor such that:
 a source of the second HEMT transistor is electrically connected to the source of the first HEMT transistor,
 a drain of the second HEMT transistor is electrically connected to the drain of the first HEMT transistor,
 a gate of the second HEMT transistor is electrically connected to the source of the second HEMT transistor via at least one first resistor of a value higher than about 1 MΩ and is electrically connected to the drain of the second HEMT transistor via at least one second resistor of a value higher than about 1 MΩ,
 a value of a threshold voltage $V_{th2}$ of the second HEMT transistor is zero,
 and the bias means may also be able to forward bias the first HEMT transistor and the second HEMT transistor by applying an electric voltage $V_{SD}$ of a negative value. Such an electronic device has the advantage, during a forward bias, of having a behaviour similar to that of a forward biased Zener diode, in addition to the behaviour of a reverse biased Zener diode the value of the Zener voltage of which is programmable.

The electronic device may further include a second HEMT transistor such that:
 a source of the second HEMT transistor is electrically connected to the drain of the first HEMT transistor,
 a drain of the second HEMT transistor is electrically connected to the source of the first HEMT transistor,
 a gate of the second HEMT transistor is electrically connected to the source of the second HEMT transistor,
 and the second HEMT transistor may be able to be ON when the value of an electric voltage $V_{GD2}$ between the gate of the second HEMT transistor and the drain of the second HEMT transistor is higher than that of a threshold voltage $V_{th2}$ of the second HEMT transistor. Such an electronic device has the advantage of having a behaviour similar to that of a bidirectional Zener diode, namely that, in reverse bias, is ON when the voltage $V_{SD}$ is higher than the value of a first Zener voltage, and which is also ON, in forward bias, when this voltage $V_{SD}$ is lower than the value of a second Zener voltage.

In this case, that is when the electronic device is configured according to the second configuration, the gate of the second HEMT transistor may be directly electrically connected to the source of the second HEMT transistor and the second HEMT transistor may be of the enhancement type. Thus, the value of the voltage $V_{GS2}$ between the gate and the source of the second HEMT transistor is zero and the value of the voltage beyond which the current can pass through the electronic device, in forward bias, that is the second Zener voltage, can be adjusted via the adjustment of the value of the threshold voltage $V_{th2}$ of the second HEMT transistor.

Alternatively, and when the electronic device is configured according to the second configuration, the gate of the second HEMT transistor may be electrically connected to the source of the second HEMT transistor via a second voltage source able to apply a non-zero electric voltage $V_{GS2}$ between the gate of the second HEMT transistor and the source of the second HEMT transistor. In this case, the gate of the second HEMT transistor is used to offset the value of the voltage from which the second HEMT transistor, and thus also the electronic device, will switch from a totally OFF state to an ON state with a very small resistivity. Thus, the value of the voltage (second Zener voltage) beyond which the current can pass through the forward biased electronic device can be set via the adjustment of the value of the threshold voltage $V_{th2}$ of the second HEMT transistor and/or via the a posteriori adjustment of the value of the voltage $V_{GS2}$ outputted by the second voltage source. This alternative enables an electronic device the behaviour of which corresponds to that of a bidirectional and programmable Zener diode to be made.

Alternatively, the electronic device may be such that:
the source of the first HEMT transistor is electrically connected to an electric power terminal of the electronic device via a resistor,
the drain of the first HEMT transistor is electrically connected to a reference potential,
an input of the electronic device is electrically connected to the gate of the first HEMT transistor,
an output of the electronic device is electrically connected to the source of the first HEMT transistor,
and the electronic device may be able to output, between the output of the electronic device and the reference potential, an output voltage of a positive value when a value of an input voltage applied between the input of the electronic device and the reference potential is higher than that of the threshold voltage $V_{th}$ of the first HEMT transistor. In such an alternative, the electronic device thus corresponds to a voltage comparator enabling the value of the input voltage to be compared with the value of the threshold voltage $V_{th}$ of the first HEMT transistor.

The first HEMT transistor may include a first AlGaN/GaN heterostructure, and/or when the electronic device includes the second HEMT transistor, the second HEMT transistor may include a second AlGaN/GaN heterostructure.

It is also proposed an electronic device including at least:
a first HEMT transistor,
bias means able to at least reverse bias the first HEMT transistor by applying an electric voltage $V_{SD}$ of a positive value between a source of the first HEMT transistor and a drain of the first HEMT transistor,
wherein:
the source of the first HEMT transistor is electrically connected to an electric power terminal of the electronic device via a resistor,
the drain of the first HEMT transistor is electrically connected to a reference potential,
an input of the electronic device is electrically connected to the gate of the first HEMT transistor,
an output of the electronic device is electrically connected to the source of the first HEMT transistor,
and wherein the first HEMT transistor is able to be ON when a value of an electric voltage $V_{GD}$ between a gate of the first HEMT transistor and the drain of the first HEMT transistor is higher than a value of a threshold voltage $V_{th}$ of the first HEMT transistor, and the electronic device is able to output, between the output of the electronic device and the reference potential, an output voltage of a positive value when a value of an input voltage applied between the input of the electronic device and the reference potential is higher than that of the threshold voltage $V_{th}$ of the first HEMT transistor.

It is also proposed a method for controlling the flow of an electric current at least from a first end of an electrical connection to a second end of the electrical connection, wherein:
the electrical connection is made by electrically connecting a source of a first HEMT transistor to the first end and by electrically connecting a drain of the first HEMT transistor to the second end, and then
the first HEMT transistor is at least reverse biased by applying an electric voltage $V_{SD}$ of a positive value between the source of the first HEMT transistor and the drain of the first HEMT transistor;
and wherein the electric current flows from the first end to the second end through the first HEMT transistor when a value of an electric voltage $V_{GD}$ between a gate of the first HEMT transistor and the drain of the first HEMT transistor is higher than a value of a threshold voltage $V_{th}$ of the first HEMT transistor.

It is also proposed a method for controlling the flow of an electric current at least from a first end of an electrical connection to a second end of the electrical connection, wherein the electrical connection is made by electrically connecting a source of a first HEMT transistor to the first end, by electrically connecting a drain of the first HEMT transistor to the second end, and by electrically connecting a gate of the first HEMT transistor to the source of the first HEMT transistor, the electrical connection being configured according to a first configuration or a second configuration, the first configuration being such that:
a source of a second HEMT transistor is electrically connected to the source of the first HEMT transistor,
a drain of the second HEMT transistor is electrically connected to the drain of the first HEMT transistor,
a gate of the second HEMT transistor is electrically connected to the source of the second HEMT transistor via at least one first resistor of a value higher than about 1 MΩ and is electrically connected to the drain of the second HEMT transistor via at least one second resistor of a value higher than about 1 MΩ,
the value of a threshold voltage $V_{th2}$ of the second HEMT transistor is zero,
the second configuration being such that:
the source of a second HEMT transistor is electrically connected to the drain of the first HEMT transistor,
the drain of the second HEMT transistor is electrically connected to the source of the first HEMT transistor,
the gate of the second HEMT transistor is electrically connected to the source of the second HEMT transistor,
then the first HEMT transistor is at least reverse biased by applying an electric voltage $V_{SD}$ of a positive value between the source of the first HEMT transistor and the drain of the first HEMT transistor, the electric current flowing from the first end to the second end through the first HEMT transistor when a value of an electric voltage $V_{GD}$ between a gate of the first HEMT transistor and the drain of the first HEMT transistor is higher than a value of a threshold voltage $V_{th}$ of the first HEMT transistor,
wherein, when the electrical connection is configured according to the first configuration:
when the first HEMT transistor is reverse biased, the second HEMT transistor is also reverse biased, or the first HEMT transistor and the second HEMT transistor are forward biased by applying an electric voltage $V_{SD}$ of a negative value such that the electric current flows in this case from the second end to the first end through the second HEMT transistor,
and wherein, when the electrical connection is configured according to the second configuration:
when the first HEMT transistor is reverse biased, the second HEMT transistor is forward biased, or the first HEMT transistor is forward biased and the second HEMT transistor is reverse biased by applying an electric voltage $V_{SD}$ of a negative value such that the electric current flows in this case from the second end to the first end through the second HEMT transistor when the value of an electric voltage $V_{GD2}$ between the gate of the second HEMT transistor and the drain of the second HEMT transistor is higher than that of a threshold voltage $V_{th2}$ of the second HEMT transistor.

The electrical connection is further made by electrically connecting the gate of the first HEMT transistor to the source of the first HEMT transistor.

In this case, the electrical connection may be made by directly connecting the gate of the first HEMT transistor to the source of the first HEMT transistor, the first HEMT transistor being of the enhancement type, and the electric current may flow from the first end to the second end through the first HEMT transistor when the value of the electric voltage $V_{SD}$ is higher than that of the threshold voltage $V_{th}$ of the first HEMT transistor.

Alternatively, the electrical connection may be made by electrically connecting the gate of the first HEMT transistor to the source of the first HEMT transistor via a first voltage source able to apply a non-zero electric voltage $V_{GS}$ between the gate of the first HEMT transistor and the source of the first HEMT transistor, and further including, prior to the reverse bias of the first HEMT transistor, the first voltage source applying the electric voltage $V_{GS}$ of a value equal to the difference between the value of the threshold voltage $V_{th}$ of the first HEMT transistor and a value of the electric voltage $V_{SD}$ beyond which the electric current is intended to flow from the first end to the second end through the first HEMT transistor.

The electrical connection may be made such that:
  a source of a second HEMT transistor is electrically connected to the source of the first HEMT transistor,
  a drain of the second HEMT transistor is electrically connected to the drain of the first HEMT transistor,
  a gate of the second HEMT transistor is electrically connected to the source of the second HEMT transistor via at least one first resistor of a value higher than about 1 MΩ and is electrically connected to the drain of the second HEMT transistor via at least one second resistor of a value higher than about 1 MΩ,
  the value of a threshold voltage $V_{th2}$ of the second HEMT transistor is zero,
  and, when the first HEMT transistor is reverse biased, the second HEMT transistor may also be reverse biased, or the first HEMT transistor and the second HEMT transistor may be forward biased by applying an electric voltage $V_{SD}$ of a negative value such that the electric current flows in this case from the second end to the first end through the second HEMT transistor.

Alternatively, the electrical connection may be made such that:
  a source of a second HEMT transistor is electrically connected to the drain of the first HEMT transistor,
  a drain of the second HEMT transistor is electrically connected to the source of the first HEMT transistor,
  a gate of the second HEMT transistor is electrically connected to the source of the second HEMT transistor,
  and, when the first HEMT transistor is reverse biased, the second HEMT transistor is forward biased, or the first HEMT transistor may be forward biased and the second HEMT transistor may be reverse biased by applying an electric voltage $V_{SD}$ of a negative value such that the electric current flows in this case from the second end to the first end through the second HEMT transistor when the value of an electric voltage $V_{GD2}$ between the gate of the second HEMT transistor and the drain of the second HEMT transistor is higher than that of a threshold voltage $V_{th2}$ of the second HEMT transistor.

In this case, that is when the electrical connection is configured according to the second configuration, the electrical connection may be made by directly connecting the gate of the second HEMT transistor to the source of the second HEMT transistor, the second HEMT transistor being of the enhancement type, and wherein the electric current may flow from the second end to the first end through the second HEMT transistor when the value of the electric voltage $V_{SD}$ is lower than that of the threshold voltage $V_{th2}$ of the second HEMT transistor.

Alternatively, and when the electrical connection is configured according to the second configuration, the electrical connection may be made by electrically connecting the gate of the second HEMT transistor to the source of the second HEMT transistor via a second voltage source able to apply a non-zero electric voltage $V_{GS2}$ between the gate of the second HEMT transistor and the source of the second HEMT transistor, and the method may further include, prior to the reverse bias of the second HEMT transistor, the second voltage source applying the electric voltage $V_{GS2}$ of a value equal to the difference between the value of the threshold voltage $V_{th2}$ of the second HEMT transistor and a value of the electric voltage $V_{SD}$ below which the electric current is intended to flow from the second end to the first end through the second HEMT transistor.

In another configuration, the electrical connection may be made such that:
  the source of the first HEMT transistor is electrically connected to an electric power terminal via a resistor forming the first end of the electrical connection,
  the drain of the first HEMT transistor is electrically connected to a reference potential forming the second end of the electrical connection,
  the gate of the first HEMT transistor is electrically connected to an input,
  the source of the first HEMT transistor is electrically connected to an output,
  the method may further include, after the reverse bias of the first HEMT transistor, applying an input voltage between the input and the reference potential, and an output voltage of a positive value may be outputted between the output and the reference potential when a value of an input voltage is higher than that of the threshold voltage $V_{th}$ of the first HEMT transistor.

It is also proposed a method for controlling the flow of an electric current at least from a first end of an electrical connection to a second end of the electrical connection, wherein the electrical connection is made by electrically connecting:
  a source of a first HEMT transistor to the first end,
  a drain of the first HEMT transistor to the second end,
  the source of the first HEMT transistor to an electric power terminal via a resistor forming the first end of the electrical connection,
  the drain of the first HEMT transistor to a reference potential forming the second end of the electrical connection,
  the gate of the first HEMT transistor to an input,
  the source of the first HEMT transistor to an output,
  then the first HEMT transistor is at least reverse biased by applying an electric voltage $V_{SD}$ of a positive value between the source of the first HEMT transistor and the drain of the first HEMT transistor, the electric current flowing from the first end to the second end through the first HEMT transistor when a value of an electric voltage $V_{SD}$ between a gate of the first HEMT transistor and the drain of the first HEMT transistor is higher than a value of a threshold voltage $V_{th}$ of the first HEMT transistor, the method further including, after the reverse bias of the first HEMT transistor, applying an input voltage between the input and the reference potential, and wherein an output voltage of a positive value is outputted between the output and the reference potential when a value of an input voltage is higher than that of the threshold voltage $V_{th}$ of the first HEMT transistor.

BRIEF DESCRIPTION OF THE DRAWINGS

The present invention will be better understood upon reading the description of exemplary embodiments given by way of purely indicating and no way limiting purposes with reference to the appended drawings wherein.

Identical, similar or equivalent parts of the different figures described hereafter bear the same reference numerals so as to facilitate switching from one figure to the other.

Different parts shown in the figures are not necessarily drawn at a uniform scale, to make the figures more legible.

Different possibilities (alternatives and embodiments) should be understood as being not exclusive from one each other and can be combined to each other.

DETAILED DISCLOSURE OF PARTICULAR EMBODIMENTS

Figure 1:
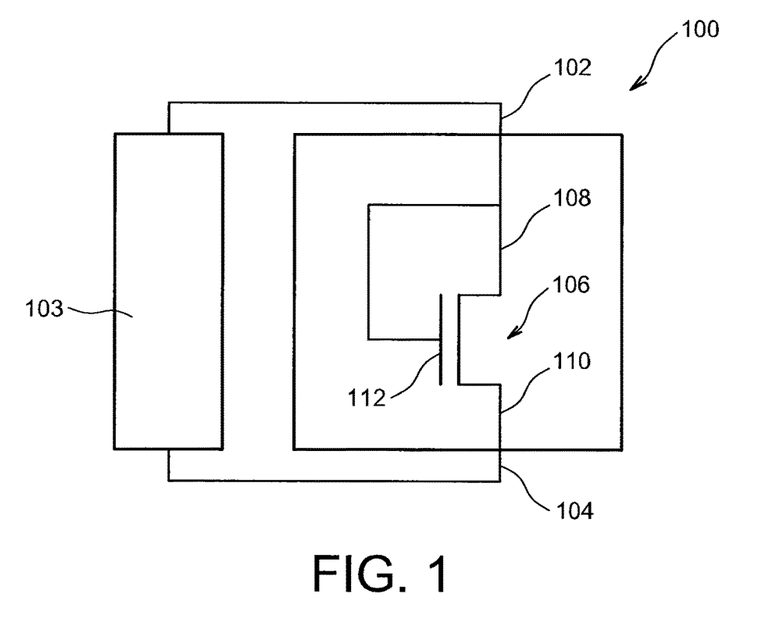
FIG. 1 schematically shows an electronic device according to a first embodiment, FIG. 2 schematically shows a HEMT transistor being part of an electronic device according to one embodiment, FIG. 3 schematically shows the output electric characteristic of a HEMT transistor, FIG. 4 schematically shows an electronic device according to a second embodiment, FIG. 5 schematically shows an electronic device according to a third embodiment, FIG. 6 schematically shows an electronic device according to a fourth embodiment, FIG. 7 schematically shows an electronic device according to a fifth embodiment.

FIG. 1 will be first referred to which schematically shows an electronic device 100 according to a first embodiment.

The electronic device 100 has an operation similar to that of a reverse biased Zener diode. Thus, the electronic device 100 is provided on an electrical connection, between a first end 102 whereon an electric current is intended to be applied, and a second end 104 at which the electric current is intended to be outputted. The electronic device 100 enables to control whether the current flows or not from the first end 102 to the second end 104 as a function of the value of the voltage across the terminals of both these ends 102, 104. The electronic device 100 is intended to be ON when the electric voltage between the first end 102 and the second end 104, called $V_{102}$-$V_{104}$, corresponding to the difference between the electric potential at the first end 102, called $V_{102}$, and the electric potential at the second end 104, called $V_{104}$, is higher than a non-zero value which will be called Zener voltage because of the similar behaviour of the electronic device 100 with that of a reverse biased Zener diode. Further, when the electronic device 100 is ON, the value of the voltage $V_{102}$-$V_{104}$, is substantially constant regardless of the value of this electric current.

To achieve such an operation, the electronic device 100 includes a first HEMT transistor 106, also called HFET ("Heterostructure Field-Effect Transistor") transistor or MODFET ("Modulated-Doping Field-Effect Transistor"), a source 108 of which is electrically connected to the first end 102, a drain 110 of which is electrically connected to the second end 104, and a gate 112 of which is electrically connected to the source 108. In this first embodiment, the gate 112 is directly connected to the source 108 through an electrical wire or track, and the first HEMT transistor 106 is of the enhancement type, or "normally off".

Figure 2:
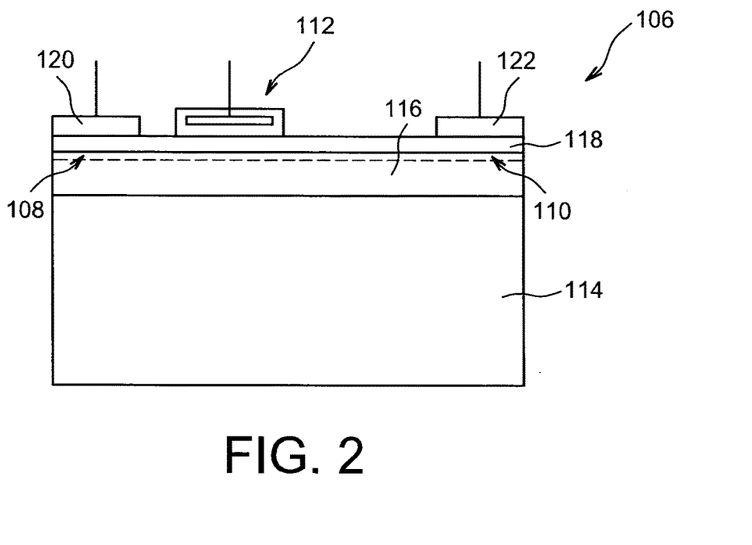

An exemplary embodiment of the first HEMT transistor 106 is schematically shown in FIG. 2.

The first HEMT transistor 106 includes a substrate 114, for example of silicon, SiC, sapphire or GaN, whereon is provided a heterojunction formed by a layer 116 of a high band gap material, for example of GaN, and a layer 118 of a higher band gap material, for example of AlGaN. The layers 116 and 118 could also consist of GaAs and AlGaAs respectively, or other materials having a band gap suitable for making a heterostructure. A buffer layer, not shown in FIG. 2, is generally present between the substrate 114 and the layer 116, for example comprising AlN and GaN and enabling a lattice match to be made for growing the layers 116 and 118 on the substrate 114. The first HEMT transistor 106 also includes a first ohmic contact 120 in contact with the source 108 of the first HEMT transistor 106 and a second ohmic contact 122 in contact with the drain 110 of the first HEMT transistor 106. Finally, the first HEMT transistor 106 includes the gate 112 formed by a metal and a gate dielectric in the layer 118. Alternatively, it is possible to have, on the layer 118, another GaN or SiN layer enabling a passivation of the surface charges to be made. In the example of FIG. 2, the distance between the gate 112 and the first contact 120 is lower than that between the gate 112 and the second contact 122. However, it is possible that these distances be similar to each other.

In the first HEMT transistor 106, the juxtaposition of the higher band gap material of the layer 118 and the smaller band gap material of the layer 116 creates a conduction band discontinuity at the interface between both materials. This heterojunction causes the formation of a potential well, or quantum well, in the smaller band gap material where the electrons from the layer 118 are transferred and accumulate. The accumulation of the electrons in this well is also called two dimensional electron gas (2DEG) and is symbolically shown in FIG. 2 by a dotted line, this electron gas being formed between the interface of the layers 116 and 118 and this dotted line.

Figure 3:
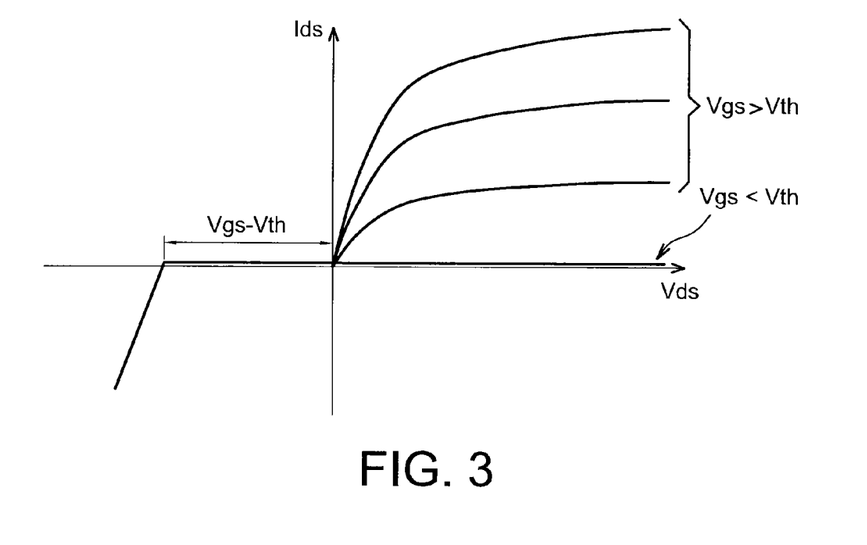

The output electric characteristic of the first HEMT transistor 106 is shown in FIG. 3.

In the first part corresponding to a forward bias of the first HEMT transistor 106 (positive $V_{DS}$ and $I_{DS}$, $V_{DS}$ being the voltage between the drain 110 and the source 108 of the first HEMT transistor 106, and $I_{DS}$ being the current flowing between the drain 110 and the source 108 of the first HEMT transistor 106), the first HEMT transistor 106 is ON when the value of the voltage $V_{GS}$ (voltage between the gate 112 and the source 108 of the first HEMT transistor 106) is higher than the value of the voltage $V_{th}$ corresponding to the threshold voltage of the first HEMT transistor 106. The value of this threshold voltage $V_{th}$ of the first HEMT transistor 106 depends on different physical parameters of the first HEMT transistor 106 (materials used, dimensions of different layers, etc.) and is for example equal to about −4 V in the case of a depletion HEMT transistor (or "normally on") or equal to about 2 V in the case of an enhancement HEMT transistor. On the other hand, the first HEMT transistor 106 remains OFF when $V_{GS}$ is lower than Vth. In the electronic device 100 shown in FIG. 1, because the source 108 of the first HEMT transistor 106 is directly connected to the gate 112 of the first HEMT transistor 106 and the first HEMT transistor 106 is of the enhancement type, the first HEMT transistor 106 always remains OFF in the case of a forward bias of the first HEMT transistor 106.

In the third part corresponding to a reverse bias of the first HEMT transistor 106 (negative $V_{DS}$ and $I_{DS}$ the first HEMT transistor 106 is OFF as long as $V_{DS}>V_{GS}-V_{th}$. On the other hand, the first HEMT transistor 106 becomes ON when $V_{DS}<V_{GS}-V_{th}$ and in this case, the value of the voltage $V_{DS}$ remains substantially constant regardless of the value of the current $I_{DS}$. The term "substantially constant" is used because in reality, when $V_{DS}<V_{Gs}-V_{th}$, the value of the voltage $V_{DS}$ varies slightly as a function of the current $I_{DS}$, this variation being a function of a slope $I_{DS}(V_{DS})$ equal to the value of the resistance Ron of the transistor in the first part, which is for example equal to about 10 mOhm in the case of a 100 A/600 V HEMT transistor.

In the electronic device 100, the gate 112 of the first HEMT transistor 106 is directly connected to the source 108 of the first HEMT transistor 106, the voltage $V_{GS}$ is thus always zero, and the first HEMT transistor 106 is OFF when $V_{DS}>-V_{th}$ and becomes ON when $V_{DS}<-V_{th}$. For example, if $V_{th}=2$ V, this means that the electronic device 100 remains OFF when the voltage $V_{102}-V_{104}$, which corresponds to the voltage $V_{SD}$ or $-V_{DS}$, is lower than 2 V, but that the electronic device 100 becomes ON when the voltage $V_{SD}$ is higher than or equal to 2 V.

The Zener voltage of this electronic device 100 is thus equal to the threshold voltage $V_{th}$ of the first HEMT transistor 106. The value of this threshold voltage $V_{th}$ of the first HEMT transistor 106 can be adjusted upon making the first HEMT transistor 106 by etching the layer 118 of the higher band gap material of the transistor and/or making an implantation of electrical charges in the layer 118. The layer 118 is fully etched in order to remove the 2DEG gas, an insulation under the gate is then added in order to recover a MOS type operation which then requires a positive bias on the gate to "repopulate" the zone deserted by the 2DEG gas. Details on the manufacture of such a HEMT transistor are described for example in document "High Voltage Normally-off GaN MOSC-HEMTs on Silicon Substrates for Power Switching Applications" by Zhongda Li and al. Proc. Int. Symp. Power Semicond. Devices ICs, pp. 45-48, 2012.

In the electronic device 100 shown in FIG. 1, the bias voltage $V_{SD}$ is outputted by an element 103 symbolizing all the electronic elements of the circuit wherein the electronic device 100 is integrated and which output between the ends 102 and 104 the bias voltage $V_{SD}$. The bias means of the first HEMT transistor 106 are thus formed by the ends 102 and 104 and by the element 103.

Figure 4:
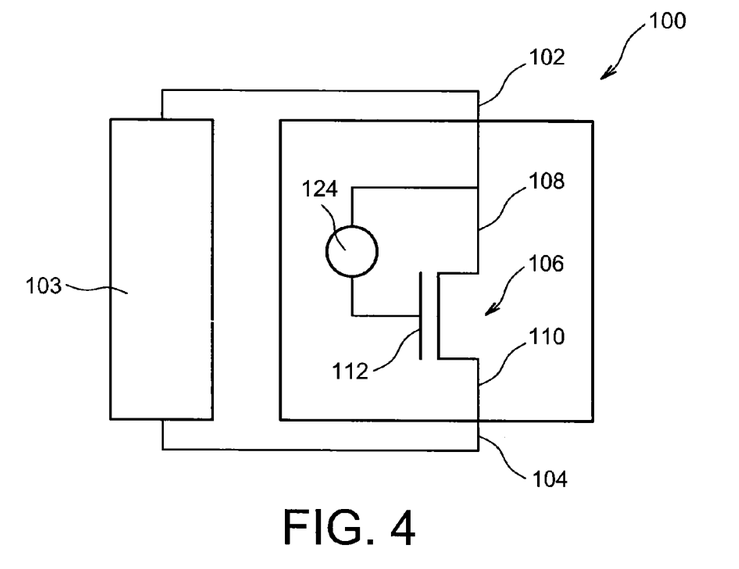

FIG. 4 shows an electronic device 100 according to a second embodiment.

As in the first embodiment, the electronic device 100 according to the second embodiment is electrically connected to the bias means formed by the element 103, the first end 102 and the second end 104, and includes the first HEMT transistor 106. Unlike the first embodiment wherein the gate 112 of the first HEMT transistor 106 is directly connected to the source 108 of the first HEMT transistor 106, the gate 112 is herein electrically connected to the source 108 via a first voltage source 124 enabling the voltage $V_{GS}$ applied between the gate 112 and the source 108 of the first HEMT transistor 106 to be adjusted. Moreover, in this second embodiment, the first HEMT transistor 106 can be of the enhancement type as in the first embodiment, or of the depletion type ("normally on"). The first HEMT transistor 106 is preferably of the depletion type because the manufacture of this type of transistor is simpler than the manufacture of an enhancement HEMT transistor.

The value of the voltage $V_{GS}$ applied by the first voltage source 124 is a function of the Zener voltage desired for the electronic device 100, as well as the value of the threshold voltage $V_{th}$ of the first HEMT transistor 106. Thus, the first HEMT transistor 106 is OFF as long as $V_{SD}<V_{th}-V_{GS}$ and becomes ON when $V_{SD}>V_{th}-V_{GS}$. In the case of a first depletion HEMT transistor 106 the threshold voltage $V_{th}$ of which is for example equal to −4 V, if the desired Zener voltage of the electronic device 100 is 1 V, the voltage outputted by the first voltage source 124 is selected such that $V_{GS}=-5$ V (the conduction of the first HEMT transistor 106 being in this case ensured when $V_{SD}>V_{th}-V_{GS}=>V_{SD}>-4+5=>V_{SD}>1$ V). In the case of a first enhancement HEMT transistor 106 the threshold voltage $V_{th}$ of which is for example equal to 2 V, if the desired Zener voltage of the electronic device 100 is 3 V, the voltage outputted by the first voltage source 124 is selected such that $V_{GS}=-1$ V (the conduction of the first HEMT transistor 106 being in this case ensured when $V_{SD}>V_{th}-V_{GS}=>V_{SD}>2+1=>V_{SD}>3$ V).

Thus, the electronic device 100 according to this second embodiment has an operation analogous to that of a reverse biased Zener diode the Zener voltage of which is programmable and for example between about −8 V and 6 V with a threshold voltage $V_{th}$ for example between −10 V and 10 V (the maximum values of $V_{GS}$ being related to the voltage withstand of the transistor gate).

Figure 5:
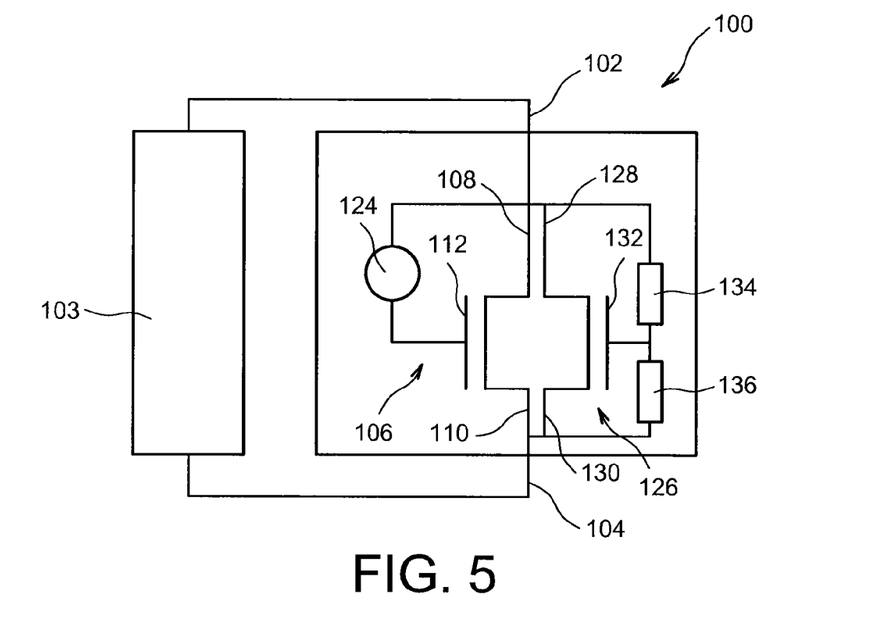

FIG. 5 shows an electronic device 100 according to a third embodiment.

As in the second embodiment, the electronic device 100 is electrically connected to the first end 102, the second end 104 and the element 103, and includes the first HEMT transistor 106 and the first voltage source 124. In this third embodiment, the electronic device 100 also includes a second HEMT transistor 126 the source 128 of which is electrically connected to the first end 102 (and thus also to the source 108 of the first HEMT transistor 106) and the drain 130 of which is electrically connected to the second end 104 (and thus also to the drain 110 of the first HEMT transistor 106). The gate 132 of the second HEMT transistor 126 is electrically connected to the source 128 of the second HEMT transistor 126 via a first resistor 134 and is electrically connected to the drain 130 of the second HEMT transistor 126 via a second resistor 136. The values of the first and second resistors 134, 136 are higher than about 1 MΩ, and for example between about 1 MΩ and 10 MΩ. The second HEMT transistor 126 is made such that its threshold voltage $V_{th2}$ is higher than 0 V. As previously described, the value of this threshold voltage $V_{th2}$ of the second HEMT transistor 126 can be defined upon making the second HEMT transistor 126 for example by etching the layer of the higher band gap material of the HEMT transistor.

When the HEMT transistors 106 and 126 are reverse biased (positive voltage $V_{SD}$ between the source and the drain of both HEMT transistors 106 and 126, that is such that an input current is applied on the device 100 from the first end 102), the operation of the electronic device 100 according to this third embodiment is similar to that of the electronic device 100 according to the second embodiment, this current then passing through the first HEMT transistor 106 to reach the second end 104 when the voltage $V_{SD}$ across the terminals of the first HEMT transistor 106 is higher than the Zener voltage defined for the electronic device 100 (a function of $V_{th}$ and $V_{GS}$). The second HEMT transistor 126 is in this case OFF because both resistors 134 and 136 are such that $V_{GD}<V_{th2}$, that is $V_{GS}<V_{th2}-V_{SD}$. For example, if $V_{SD}=1$ V and $V_{th2}=2$ V, the values of both resistors can be selected such that $V_{GD}=-0.5$ V in order to fulfil the condition $V_{GS}<1$ V. Further, since both resistors 134 and 136 form a voltage divider bridge, the relationship $V_{GD}<V_{SD}$ is always respected.

However, when the HEMT transistors 106 and 126 are forward biased with a voltage $V_{SD}$ of a negative value (which corresponds to having a positive input current on the second end 104), the voltage $V_{GS2}$ between the gate 132 and the source 128 of the second HEMT transistor 126 is in this case higher than 0, and thus higher than its threshold voltage $V_{th2}$ which is zero, which enables the current to pass through the electronic device 100 from the second end 104 to the first end 102 through the second HEMT transistor 126 which is ON in this case.

As in the second embodiment, the first HEMT transistor 106 can be of the enhancement or depletion type. The second HEMT transistor 126 is of the enhancement type.

Alternatively to this third embodiment, the electrical connection between the gate 112 and the source 108 of the HEMT transistor 106 may not include the first voltage source 124 but be directly made by an electrical wire or track, as previously described in connection with FIG. 1 for the first embodiment. In this case, the value of the Zener voltage beyond which the current passes through the electronic device 100 from the end 102 to the second end 104 only depends on the value of the threshold voltage $V_{th}$ of the first HEMT transistor 106 which is in this case of the enhancement type.

Figure 6:
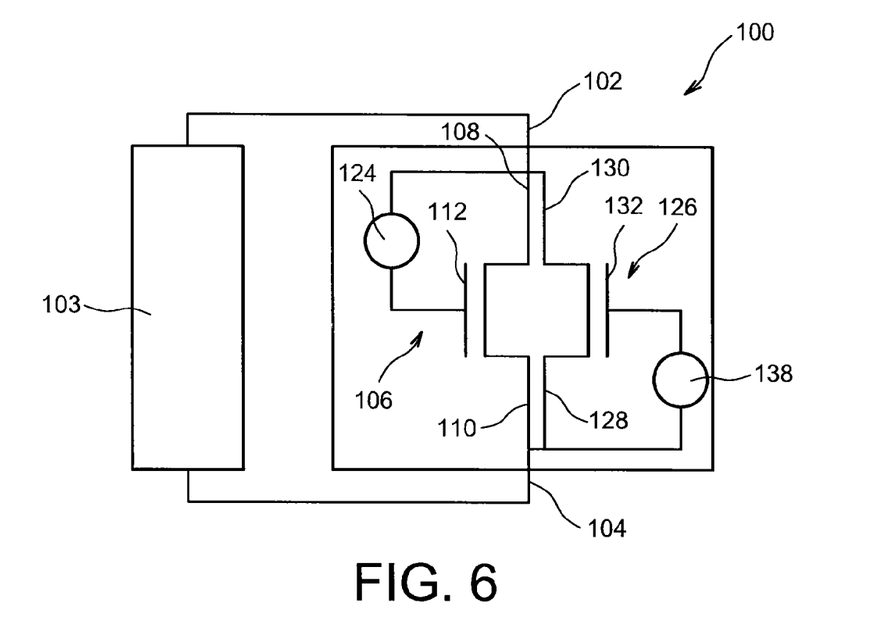

FIG. 6 shows an electronic device 100 according to a fourth embodiment.

As in the second embodiment, the electronic device 100 is electrically connected to the first end 102, to the second end 104 and the element 103, and includes the first HEMT transistor 106 and the first voltage source 124. In this fourth embodiment, the electronic device 100 also includes the second HEMT transistor 126 the source 128 of which is electrically connected to the second end 104 (and thus also to the drain 110 of the first HEMT transistor 106) and the drain 130 of which is electrically connected to the first end 102 (and thus also to the source 108 of the first HEMT transistor 106). Both HEMT transistors 106 and 126 are thus electrically connected in a head to foot manner with respect to each other. The gate 132 of the second HEMT transistor 126 is electrically connected to the source 128 of the second HEMT transistor 126 through a second voltage source 138 enabling the voltage $V_{GS2}$ applied between the gate 132 and the source 128 of the second HEMT transistor 126 to be adjusted.

When an input current is applied on the first end 102, that is when the voltage $V_{SD}$ is positive, reverse biasing the first HEMT transistor 106 and forward biasing the second HEMT transistor 126, the operation of the electronic device 100 according to this fourth embodiment is similar to that of the electronic device 100 according to the second embodiment, this current then passing through the first HEMT transistor 106 to reach the second end 104 when the voltage $V_{SD}$ between the source 108 and the drain 110 of the first HEMT transistor 106 is higher than a first Zener voltage defined for the electronic device 100, the value of this first Zener voltage being a function of the values of the voltage $V_{GS}$ applied by the first voltage source 124 and the threshold voltage $V_{th}$ of the first HEMT transistor 106. Since the second HEMT transistor 126 is in this case forward biased, one should make sure that $V_{GS2}<V_{th2}$. On the other hand, when a reverse current is applied on the electronic device 100 according to this fourth embodiment, that is when the first HEMT transistor 106 is forward biased and the second HEMT transistor 126 is reverse biased (which corresponds to applying a positive input current on the device from the second end 104), this current then passes through the second HEMT transistor 126 from the second end 104 to the first end 102 when the voltage $V_{SD}$, which corresponds to the voltage between the source 108 and the drain 110 of the first HEMT transistor 106 but also to the voltage between the drain 130 and the source 128 of the second HEMT transistor 126, which is negative and lower than a second Zener voltage defined for the electronic device 100, the value of this second Zener voltage being a function of the values of the voltage $V_{GS2}$ applied by the second voltage source 138 and the threshold voltage $V_{th2}$ of the second HEMT transistor 126.

The electronic device 100 according to this fourth embodiment thus has a behaviour analogous to that of a bidirectional Zener diode, that is the behaviour of two Zener diodes connected in series to each other at the anode of one of the Zener diodes and the cathode of the other of the Zener diodes, and which are programmable.

Alternatively, the electrical connection between the source 108 and the gate 112 of the first HEMT transistor 106 formed by the first voltage source 124 can be replaced by a direct electrical connection formed by an electrical wire or track, as previously described in connection with FIG. 1 for the first embodiment. In this case, the value of the first Zener voltage beyond which the current passes through the electronic device 100 from the first end 102 to the second end 104 only depends on the value of the threshold voltage $V_{th}$ of the first HEMT transistor 106 which is in this case of the enhancement type. Further, it is also possible that the electrical connection between the source 128 and the gate 132 of the second HEMT transistor 126 formed by the second voltage source 138 can be replaced by a direct electrical connection formed by an electrical wire or track. In this case, the value of the second Zener voltage beyond which the current passes through the electronic device 100 from the second end 104 to the first end 102 only depends on the value of the threshold voltage $V_{th2}$ of the second HEMT transistor 126 which is in this case of the enhancement type.

In the embodiments previously described, the HEMT transistor(s) 106, 126 are diverted from their usual operation thanks to the reverse bias of this (these) HEMT transistor(s) 106, 126. The electronic device 100 thus includes bias means 102, 103 and 104 enabling the HEMT transistor(s) of the electronic device to be reverse biased via the application of a positive voltage $V_{SD}$ between the source and the drain of the HEMT transistor(s).

Figure 7:
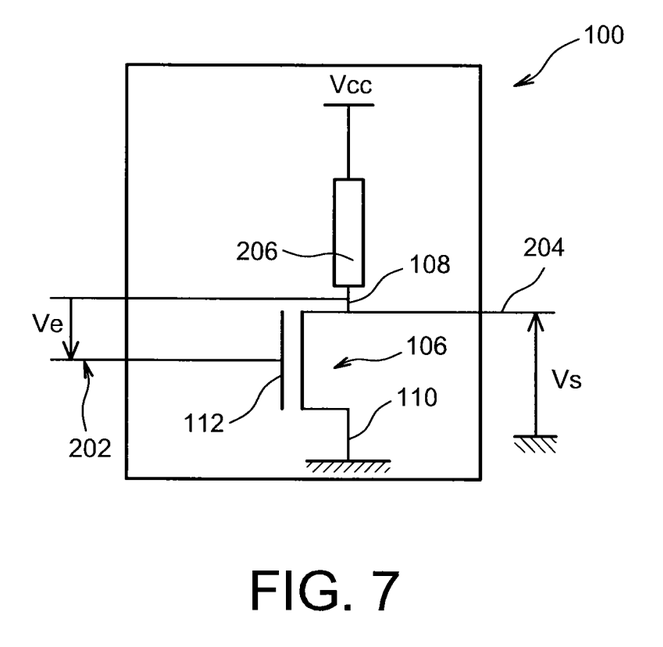

FIG. 7 schematically shows an electronic device 100 according to a fifth embodiment. Unlike the previous embodiments wherein the purpose of the electronic device 100 is to control the conductivity of the electrical connection between the first end 102 and the second end 104, the electronic device 100 according to this fifth embodiment corresponds to a voltage comparator enabling the value of a voltage applied at the input of the electronic device 100 to be compared with a Zener voltage of this electronic device 100, and a certain voltage to be outputted when this voltage applied at the input of the electronic device 100 is higher than the Zener voltage of the electronic device 100.

The electronic device 100 includes the first HEMT transistor 106 the gate 112 and the source 108 of which are electrically connected to an input 202 of the electronic device 100 enabling an input voltage Ve to be applied between the gate 112 and the source 108, and the source 108 of which is electrically connected to an output 204 of the electronic device 100. The drain 110 of the first HEMT transistor 106 is electrically connected to a reference potential, corresponding for example to a ground of the electronic device 100. The source 108 is also connected to a first terminal of a resistor 206. A power voltage Vcc is applied to a second terminal of the resistor 206. The reverse bias means of the first HEMT transistor 106 here correspond to the power voltage Vcc, to the reference potential and to the resistor 206 enabling a positive voltage $V_{SD}$ to be applied across the terminals of the first HEMT transistor 106.

Because the first HEMT transistor 106 is ON when $V_{GS} > V_{th}$, the same is thus ON when the input voltage Ve is higher than the threshold voltage $V_{th}$ of the HEMT transistor 106 because Ve=$V_{GS}$. Thus, as long as the value of the input voltage Ve is lower than the threshold voltage $V_{th}$ of the first HEMT transistor 106, an output voltage Vs measured on the output 204 is zero. When the value of the input voltage Ve becomes higher than the threshold voltage $V_{th}$ of the first HEMT transistor 106, the output voltage Vs becomes non-zero and substantially equal to the value of the threshold voltage $V_{th}$ of the first HEMT transistor 106. Further, it is possible to set the comparison voltage by adding a voltage source between the gate 112 and the source 108 of the first HEMT transistor 106.

The invention claimed is:

1. An electronic device including at least:
a first HEMT transistor and a second HEMT transistor,
a bias circuit configured to at least reverse bias the first HEMT transistor by applying an electric voltage $V_{SD}$ of a positive value between a source of the first HEMT transistor and a drain of the first HEMT transistor,
wherein:
the first HEMT transistor is ON when in said reverse bias a value of an electric voltage $V_{GD}$ between a gate of the first HEMT transistor and the drain of the first HEMT transistor is higher than a value of a threshold voltage $V_{th}$ of the first HEMT transistor,
the gate of the first HEMT transistor is electrically connected to the source of the first HEMT transistor,
the electronic device being configured according to a first configuration or a second configuration, the first configuration being such that:
a source of the second HEMT transistor is directly electrically connected to the source of the first HEMT transistor,
a drain of the second HEMT transistor is directly electrically connected to the drain of the first HEMT transistor,
a gate of the second HEMT transistor is electrically connected to the source of the second HEMT transistor via at least one first resistor of a value higher than about 1 MΩ and is electrically connected to the drain of the second HEMT transistor via at least one second resistor of a value higher than about 1 MΩ,
a value of a threshold voltage $V_{th2}$ of the second HEMT transistor is zero,
the bias circuit is also configured to forward bias the first HEMT transistor and the second HEMT transistor by applying an electric voltage $V_{SD}$ of a negative value,
the second configuration being such that:
the source of the second HEMT transistor is directly electrically connected to the drain of the first HEMT transistor,
the drain of the second HEMT transistor is directly electrically connected to the source of the first HEMT transistor,
the gate of the second HEMT transistor is electrically connected to the source of the second HEMT transistor,
the second HEMT transistor is ON when a value of an electric voltage $V_{GD2}$ between the gate of the second HEMT transistor and the drain of the second HEMT transistor is higher than that of a threshold voltage $V_{th2}$ of the second HEMT transistor.

2. The electronic device according to claim 1, wherein:
the gate of the first HEMT transistor is directly electrically connected to the source of the first HEMT transistor and the first HEMT transistor is of an enhancement type, or
the gate of the first HEMT transistor is electrically connected to the source of the first HEMT transistor via a first voltage source able to apply an electric voltage $V_{GS}$ of a non-zero value between the gate of the first HEMT transistor and the source of the first HEMT transistor.

3. The electronic device according to claim 1, wherein, when the electronic device is configured according to the second configuration:
the gate of the second HEMT transistor is directly electrically connected to the source of the second HEMT transistor and the second HEMT transistor is of an enhancement type, or
the gate of the second HEMT transistor is electrically connected to the source of the second HEMT transistor via a second voltage source able to apply a non-zero electric voltage $V_{GS2}$ between the gate of the second HEMT transistor and the source of the second HEMT transistor.

4. The electronic device according to claim 1, wherein the first HEMT transistor includes a first AlGaN/GaN heterostructure, and/or wherein the second HEMT transistor includes a second AlGaN/GaN heterostructure.

5. A method for controlling flow of an electric current at least from a first end of an electrical connection to a second end of the electrical connection, wherein the electrical connection is made by electrically connecting a source of a first HEMT transistor to the first end, by electrically connecting a drain of the first HEMT transistor to the second end, and by electrically connecting a gate of the first HEMT transistor to the source of the first HEMT transistor, the electrical connection being configured according to a first configuration or a second configuration, the first configuration being such that:
a source of a second HEMT transistor is directly electrically connected to the source of the first HEMT transistor,
a drain of the second HEMT transistor is directly electrically connected to the drain of the first HEMT transistor,
a gate of the second HEMT transistor is electrically connected to the source of the second HEMT transistor via at least one first resistor of a value higher than about 1 MΩ and is electrically connected to the drain of the second HEMT transistor via at least one second resistor of a value higher than about 1 MΩ,
a value of a threshold voltage $V_{th2}$ of the second HEMT transistor is zero,
the second configuration being such that:
the source of a second HEMT transistor is directly electrically connected to the drain of the first HEMT transistor,
the drain of the second HEMT transistor is directly electrically connected to the source of the first HEMT transistor,
the gate of the second HEMT transistor is electrically connected to the source of the second HEMT transistor, then the first HEMT transistor is at least reverse biased by applying an electric voltage $V_{SD}$ of a positive value between the source of the first HEMT transistor and the drain of the first HEMT transistor, the electric current flowing from the first end to the second end through the first HEMT transistor when a value of an electric voltage $V_{GD}$ between the gate of the first HEMT transistor and the drain of the first HEMT transistor is higher than a value of a threshold voltage $V_{th}$ of the first HEMT transistor, wherein, when the electrical connection is configured according to the first configuration:

when the first HEMT transistor is reverse biased, the second HEMT transistor is also reverse biased, or the first HEMT transistor and the second HEMT transistor are forward biased by applying an electric voltage $V_{SD}$ of a negative value such that the electric current flows in this case from the second end to the first end through the second HEMT transistor, and wherein, when the electrical connection is configured according to the second configuration:

when the first HEMT transistor is reverse biased, the second HEMT transistor is forward biased, or the first HEMT transistor is forward biased and the second HEMT transistor is reverse biased by applying an electric voltage $V_{SD}$ of a negative value such that the electric current flows in this case from the second end to the first end through the second HEMT transistor when a value of an electric voltage $V_{GD2}$ between the gate of the second HEMT transistor and the drain of the second HEMT transistor is higher than that of a threshold voltage $V_{th2}$ of the second HEMT transistor.

6. The method according to claim 5, wherein the electrical connection is made by directly connecting the gate of the first HEMT transistor to the source of the first HEMT transistor, the first HEMT transistor being of an enhancement type, and wherein the electric current flows from the first end to the second end through the first HEMT transistor when the value of the electric voltage $V_{SD}$ is higher than that of the threshold voltage $V_{th}$ of the first HEMT transistor.

7. The method according to claim 5, wherein the electrical connection is made by electrically connecting the gate of the first HEMT transistor to the source of the first HEMT transistor via a first voltage source able to apply a non-zero electric voltage $V_{GS}$ between the gate of the first HEMT transistor and the source of the first HEMT transistor, and further including, prior to the reverse bias of the first HEMT transistor, the first voltage source applying the electric voltage $V_{GS}$ of a value equal to a difference between the value of the threshold voltage $V_{th}$ of the first HEMT transistor and a value of the electric voltage $V_{SD}$ beyond which the electric current is intended to flow from the first end to the second end through the first HEMT transistor.

8. The method according to claim 5, wherein, when the electrical connection is configured according to the second configuration, the electrical connection is made by directly connecting the gate of the second HEMT transistor to the source of the second HEMT transistor, the second HEMT transistor being of an enhancement type, and wherein the electric current flows from the second end to the first end through the second HEMT transistor when the value of the electric voltage $V_{SD}$ is lower than that of the threshold voltage $V_{th2}$ of the second HEMT transistor.

9. The method according to claim 5, wherein, when the electrical connection is configured according to the second configuration, the electrical connection is made by electrically connecting the gate of the second HEMT transistor to the source of the second HEMT transistor via a second voltage source able to apply a non-zero electric voltage $V_{GS2}$ between the gate of the second HEMT transistor and the source of the second HEMT transistor, and further including, prior to the reverse bias of the second HEMT transistor, the second voltage source applying the electric voltage $V_{GS2}$ of a value equal to a difference between the value of the threshold voltage $V_{th2}$ of the second HEMT transistor and a value of the electric voltage $V_{SD}$ below which the electric current is intended to flow from the second end to the first end through the second HEMT transistor.

* * * * *